(12) United States Patent
Kuznicki et al.

(10) Patent No.: US 11,329,180 B2
(45) Date of Patent: May 10, 2022

(54) ENTIRE SOLAR SPECTRUM MULTIPLYING CONVERTING PLATFORM UNIT FOR AN OPTIMAL LIGHT TO ELECTRICITY CONVERSION

(71) Applicant: SEGTON ADVANCED TECHNOLOGY, Versailles (FR)

(72) Inventors: Zbigniew Kuznicki, Hoenheim (FR); Patrick Meyrueis, Strasbourg (FR)

(73) Assignee: SEGTON ADVANCED TECHNOLOGY, Versailles (FR)

( * ) Notice: Subject to any disclaimer, the term of this patent is extended or adjusted under 35 U.S.C. 154(b) by 0 days.

(21) Appl. No.: 14/912,649

(22) PCT Filed: Sep. 3, 2014

(86) PCT No.: PCT/IB2014/002578
§ 371 (c)(1),
(2) Date: Feb. 18, 2016

(87) PCT Pub. No.: WO2015/033227
PCT Pub. Date: Mar. 12, 2015

(65) Prior Publication Data
US 2016/0211398 A1    Jul. 21, 2016

Related U.S. Application Data

(60) Provisional application No. 61/872,868, filed on Sep. 3, 2013.

(51) Int. Cl.
*H01L 31/042* (2014.01)
*H02N 6/00* (2006.01)
(Continued)

(52) U.S. Cl.
CPC ...... *H01L 31/055* (2013.01); *H01L 31/02168* (2013.01); *H01L 31/0549* (2014.12);
(Continued)

(58) Field of Classification Search
CPC ..................................................... H01L 37/00
(Continued)

(56) References Cited

U.S. PATENT DOCUMENTS

| 9,711,674 B2 | 7/2017 | Kuznicki et al. |
| 2007/0146910 A1 | 6/2007 | Duston et al. |

(Continued)

FOREIGN PATENT DOCUMENTS

| JP | 2013-32823 | 2/2013 |
| JP | 2013038323 A * | 2/2013 ........... H01L 31/052 |

(Continued)

OTHER PUBLICATIONS

English machine translations of JP 2013-038323 A.*
(Continued)

*Primary Examiner* — Angelo Trivisonno
(74) *Attorney, Agent, or Firm* — Seckel IP, PLLC

(57) ABSTRACT

The invention relates to a high yield multistage light-to-electricity multiplying platform unit which is provided on its front face with a protection antireflection coating or layer (1) and with an upper electrode layer (5) characterized in that it comprises: an opto-phonic platform composed of a UV radiation light-to-light down converter (2) to a particular sub-band in the visible radiation domain, a harvesting diffractive grading component (3) including an electronic passivation layer (4) and with light splitting means and one or more sub-band light into narrowed sub-band light concentration converter(s), a IR radiation up conversion dedicated light converter, a converting multiplying platform made of several optimal for each narrowed and concentrated sub-band light-to-electricity multiplying converters. A digital optical light management layer on the top, collects, filters, splits and concentrates sunlight into sub-bands and to project them onto dedicated light-to-electricity preferentially all- (Continued)

silicon converters with low-energy multiplication capacity. The UV wavelengths are absorbed and down-converted within the top nanolayer of the platform. The other spectral components of the solar light are transmitted by this top nanolayer, guided to the dedicated panel area and focused on adjusted converters.

9 Claims, 4 Drawing Sheets

(51) Int. Cl.
| | | |
|---|---|---|
| *H01L 31/055* | (2014.01) | |
| *H01L 31/054* | (2014.01) | |
| *H01L 31/0216* | (2014.01) | |
| *H01L 31/0747* | (2012.01) | |
| *H01L 31/20* | (2006.01) | |

(52) U.S. Cl.
CPC ........ *H01L 31/0747* (2013.01); *H01L 31/202* (2013.01); *Y02E 10/52* (2013.01)

(58) Field of Classification Search
USPC .................................................. 136/257, 259
See application file for complete search history.

(56) References Cited

U.S. PATENT DOCUMENTS

| | | | | | |
|---|---|---|---|---|---|
| 2007/0277869 | A1* | 12/2007 | Shan | ...................... | G02B 5/045 136/246 |
| 2008/0072959 | A1* | 3/2008 | Chen | ................. | H01L 31/02168 136/257 |
| 2008/0078444 | A1 | 4/2008 | Atanackovic | | |
| 2009/0095341 | A1* | 4/2009 | Pfenninger | ........... | H01L 31/048 136/246 |
| 2009/0314333 | A1* | 12/2009 | Shepard | ................... | G02B 6/04 136/248 |
| 2010/0038521 | A1* | 2/2010 | Clark | ..................... | B82Y 20/00 250/208.6 |
| 2011/0162700 | A1 | 7/2011 | Kuznicki et al. | | |
| 2011/0162711 | A1* | 7/2011 | Takeuchi | ............... | B82Y 20/00 136/257 |
| 2013/0082286 | A1* | 4/2013 | Finkelstein | ......... | H01L 31/0336 257/84 |
| 2014/0293422 | A1 | 10/2014 | Yang et al. | | |
| 2015/0040975 | A1* | 2/2015 | Yu | ........................... | H01L 31/18 438/94 |

FOREIGN PATENT DOCUMENTS

| | | |
|---|---|---|
| WO | 2010/089624 A1 | 8/2010 |
| WO | WO 2013/003204 | 1/2013 |
| WO | WO 2013/067955 | 5/2013 |

OTHER PUBLICATIONS

Hanna et al., "Solar conversion efficiency of photovoltaic and photoelectrolysis cells with carrier multiplication absorbers," Journal of Applied Physics 100, 074510 (2006) (Year: 2006).*
International Search Report dated Mar. 10, 2015 in corresponding application No. PCT/IB2014/0024578 (4 pages) (note: the documents cited in the ISR are not listed in this IDS since they are already of record).
International Preliminary Report on Patentability dated Mar. 8, 2016 in corresponding application No. PCT/B2014/002578 (8 pages).
European Office Action dated Oct. 16, 2018 in counterpart application No. EP 14827522.5 (in English; total 4 pages) (D1-D6 cited in the European Office Action are not listed in this IDS since they are already of record).
European Office Action dated Sep. 28, 2020 in counterpart application No. EP 14827522.5 (in English; total 4 pages) (D1-D6 cited in the European Office Action are not listed in this IDS since they are already of record).
Hanna et al., "Solar conversion efficiency of photovoltaic and photoelectrolysis cells with carrier multiplication absorbers", Journal of Applied Physics, No. 100, vol. 7, Oct. 12, 2006, pp. 174510-1 to 174510-8 (D8 cited in the EP Office Actions).

* cited by examiner

ENTIRE SOLAR SPECTRUM MULTIPLYING CONVERTING PLATFORM UNIT FOR AN OPTIMAL LIGHT TO ELECTRICITY CONVERSION

DEFINITION OF THE GUIDING INVENTIVE PRINCIPLE

The guiding principle of the invention is the optimal use of the unique possibilities of carrier low-energy secondary generation and multiplication by the simultaneous integration of optical, photonic and optoelectronic improvements. In practice this corresponds to the total, complex and particularly efficient processing of the light-to-electricity conversion of the solar spectrum. The optimized efficiency becomes real from a large range of improvements introduced via a multi-layer converter architecture developed around two coupled stages. The first of them concerns the complex light management, while the second one is devoted to the specific light-to-electricity conversion. In this way, the innate quantum rigidity of conventional semiconductor devices is avoided.

The improvement is effected through a converting and multiplying platform unit based on several implemented complementary functionalities permitting a smart treatment of the incident spectrum, including: light harvesting, light-to-light conversion, light splitting, guidance, concentration, focalization as well as light-to-electricity conversion, low-energy free-carrier generation and multiplication: i) direct, ii) across an electron bath, modulated electron transport: i) electric field stimulation, ii) local deviations, adjustments, alterations, smart free-carrier collection.

DEFINITIONS OF THE TERMS AND EXPRESSIONS

The hereunder definitions are used over the following description.

Metamaterial means an artificial material in particular derivative of silicon showing physical properties which are going beyond, complement or significantly differentiate in comparison with those of the corresponding natural material, despite the preservation of its original chemical composition. More specifically, it can be a continuous or discontinuous layer, but also a field of pearls or grains of any shape like agglomerates, and which shows in particular a very high optical absorption, a low-energy secondary generation/conversion, a low-energy multiplication of the free-carriers, particularly electrons, a specific electron transport, an increased sensitivity to excitation and a strong optical nonlinearity.

Segton is a unit of the Secondary Electron Generation Tuned on Nanoscale, i.e., conditioned elemental unit cell with its system of electron energy levels for an efficient multistage light-to-electricity conversion taking advantage of the low-energy photogeneration and multiplication of additional free-carriers, preferentially electrons, as protected by means of parallel patent applications. More generally it is also a method of, how to produce the highly useful set of electron energy levels that can be optimized for the solar spectrum conversion to electricity.

Seg-matter is a segton based metamaterial, i.e., the light-to-electricity conversion material that is constituted of homogeneously, in principle, distributed segtons that form an ordered superlattice and are plunged in a specific physical environment delimited by nanomembranes as protected by means of parallel patent applications. More generally, this expression means also the method of, how to produce the matter being able to take advantage of the set of segton energy levels.

Multi-layer architecture: signifies the design developed/settled around coupled stages; first of them concerns the complex light management, while the second one, the specific light-to-electricity conversion; each stage may contain several specific layers involved in a given operation Coupled stages: set the same device components that are working independently on specific tasks but interacting between them Complex light management: several operations on the incident light beam allowing its transformation due to: harvesting, split, controlled wavelength transformation, light-to-light conversion, guidance, concentration and focalization Light-to-electricity conversion: more or less complex transformation of the light energy into electric energy Low-energy free-carrier generation and multiplication: the secondary electron generation due to an optimal energy in silicon of about 0.3 eV; there are two generation events possible, i) direct, when the absorbed photon generates a hot electron that, in turn, generates (a) secondary electron(s) and ii) indirect, across an electron bath, when the radiation energy is absorbed by free-carriers and transmitted onto additional secondary electrons due to generating collisions with segtons Digital diffractive arrays: modulated digital microstructures (also sub-wavelength) to treat optically/photonically the incident light beam Light-management opto-photonic platform: multifunction optical and photonic equipment built as a separate stage to suitably treat the incident light spectrum to adapt it to the following light-to-electricity converters in the way to optimize the performance of the whole equipment Multiplication order: maximal number of secondary electrons that can be generated by a given photon energy UV down-conversion is the photonic light-to-light ultraviolet conversion IR up-conversion is the photonic light-to-light infrared conversion IR: infrared radiation that cannot be converted by the semiconductor device due to its band gap UV: ultraviolet radiation that is constituted of energetic photons generating exclusively one electron-hole pair (hot carriers) that is dominantly (or totally, when surface recombination appears) transformed in the heat.

OBJECTIVES AND PERSPECTIVES OF THE INVENTION

Today all light-to-electricity converters are maladjusted to the process of solar spectrum conversion. They should be rather called light-to-heat converters because only a relatively small part of the incident solar energy is recovered as electricity.

In this context, the main achievement of the present innovation is to use the total solar spectrum by overcoming the innate quantum maladjustment of semiconductor converters. The resulting physical law of the single hard photon-matter interaction, the theorem "all or nothing", can be supplemented by a multitude of coupled phenomena in the so-called soft conversion process that is based on a number of complementary effects switched on the conversion process.

When looking at the conversion as a process, it is possible to introduce a multi-faceted cascade of individual interactions between the absorption of the incident photons and the collected electrons. Such an approach increases considerably the possibilities for a global optimization of the conversion efficiency. Multiple interactions are triggered at three related levels: photon-photon, photon-electron and electron-electron.

The effects, devices and manufacturing merge into the implementation of an overall multiplying converting platform unit that works as a factory with different specialized branches where the several levels of light processing are next followed by at least three levels of electronic processing that involve: segtons, seg-matter and free-carrier collection.

Such an approach permits to associating usefully the considerable progress made in the field of light management with the independently realized steps in light-to-electricity conversion and in sub-system designs of multiplying converters and of the converting platform. For example, a specific aspect of the optimization of the converting unit concerns the optimal choice and use of multiplying converters as well as their geometrical factors, internal constitution and dimensions and their optimal arrangement.

The idea of a multistage conversion processing gives the opportunity to best implement new capabilities by the conjugated optimization of performances at each stage and of the entire device. The multilayer processing consists of two main stages. The first stage realizes the light-to-light operations on the incident photon spectrum through its harvesting-split-control-transformation and conversion-guidance-concentration-focalization. These operations take into account the specificity of subsequent stages, especially of the light-to-electricity conversion. A large range of improvements becomes reality by a proposed sequence of all the next steps.

In general, dedicated digital diffractive arrays split incident light and concentrate this light onto light-to-electricity converters, such that each converter receives a narrow portion of the incident light and thereby operates at its highest efficiency. The resulting performance can be improved by a superposition of individually treated light management steps especially photon harvesting, treatment of spectral components and the light-to-electricity conversion management. The sequence includes specifically a multistage PV conversion cycle based on free-carrier multiplication.

A light management system is based mainly on holographic digital optics and photonics. An optoelectronic management system is based on light-to-electricity free-carrier multiplying converters. In this way, each selected range of the solar spectrum is projected onto an optimized converter that works with its maximal performance, i.e. narrow spectral ranges are adapted to dedicated inorganic, preferentially all-silicon, converters. The combined conversion cycle appears with identifiable functionalities.

The second stage allows several improvements due to photon-electron and electron-electron operations induced by the transformed spectral light through low-energy carrier generation and multiplication, modulated electron transport and smart collection.

The light-to-electricity free-carrier multiplying converters are based on a metamaterial called seg-matter that is endowed with numerous generation centers called segtons. The seg-matter allows a locally modulated electron transport so that secondary electrons are instantaneously evacuated into the front face electrode and rapidely replaced by electrons from lower strata of the converter.

The converting platform in its entirety compensates inevitable losses due to reflections, absorption and transmission caused by the light management. The total gain balance is quite positive due to the use of UV and IR bands combined with the low-energy multiplication of electrons. Retrieved spectral components, i.e. spectral bands of the solar spectrum, generate more electrons than the number of recovered incident photons. The operation is not possible using conventional solutions.

BACKGROUND

Recently and quite unexpectedly there has emerged a revival of interest in silicon optoelectronics and photonics. Proposed improvements concern light management in such a way that a semiconductor converter can work at its best performance. The basic problem of converters built from inorganic materials is their quantum mismatch with the solar spectrum, i.e., their best conversion efficiency at wavelengths far from the most intense and energetic part of the solar spectrum. This problem cannot yet be solved successfully with a single instrument or a single material.

There are three modes of photon behavior to consider in photoconversion: reflection, transmission and the absorption. The absorption allows converting phonon flux into an electron flux near band gap and into both electrons and photons fluxes above band gap.

A reasonable solution proposed many years ago took the form of tandem cells. The horizontal space arrangement and vertically aligned layered architecture are condemned mainly by the lack of suitable photovoltaic materials and probably to the conservative one photon equals one electron-hole pair approach to the basic phenomenon of conversion.

Another problem concerns the permanent movement of the emitting source, i.e., the movement of the sun across the sky. This problem has been resolved by tracking the sun by using CPV systems. Although these active tracking systems can significantly increase the amount of energy produced, they consists of expensive mechanical devices that are difficult to install and require systematic maintenance. Thus significantly raises the cost of the additional electricity produced.

Another problem is the multidirectional scattering of the solar radiation by a cloudy sky and aerosols suspended in the air, not necessarily appearing at high altitude. The diffused solar radiation reaching the converter may be then attenuated under the threshold of the optimal working range. The two mentioned problems can be resolved by a so-called passive tracking, when the converter being placed once and for all in a fixed position harvests all arriving photons. Such solution represents an opto-photonic platform.

A more complicated light treatment narrows of the incident spectrum by light-to-light conversion. The light management platform down-converts the invisible UV radiation to the visible and near-IR spectral band(s) and up-converts the invisible infrared radiation to the same spectral band(s) fitting with maximum performance of converters arranged below. The energetic photons produce two fluxes: electron flux collectable current and photon flux lost to heat. For photon energies that result in carrier multiplication, the multiplication cycle is characterized by the ratio of additional photon energy to the specific segton energy $E_s$ (the mean value of $E_s$ is 0.274 eV).

Light management is above all the more efficient when paired with low-energy electron multiplication. Thus potential losses, which are inevitable when the light beam is managed, are at least partially compensated by carrier multiplying converters. This approach is even more attractive when the carrier multiplying converters are produced from silicon in the form of all-silicon devices. All-silicon converters leave considerable freedom in fitting the narrow spectral bands. This is a new opportunity to optimize light-to-electricity conversion by coupling light management with multiplying converters.

REQUIREMENTS AND SOLUTIONS

The converting platform is constituted of the two main parts: i) an opto-photonic platform for the light management and ii) carrier multiplying converters ensuring an efficient light-to-electricity conversion.

The adapted architecture has to be designed to produce the best performance for the overall equipment that can be different from the simple sum of the best performance of each stage optimized separately.

The opto-phonic platform is designed using special software. It has the largest geometrical dimensions.

The multiplying converters realized preferentially from silicon-based materials have to be adapted to the optimized sub-bands of the converted solar spectrum.

More particularly, the architecture has to allow the manufacture of an optimal arrangement to form a suitable set of optimally spaced light-to-electricity converters that improve the conversion efficiency by a complete production cycle of carriers originating from UV, visible and IR photons plus hot electrons.

Differentiation and optimization of carrier multiplying converters using narrow sub-bands of solar radiation has to be optimized. The two main converter architectures are for the UV (shallow light penetration, thin emitter, horizontal boards in a strip arrangement) and the visible (deep light penetration, thick emitter, vertical boards in a strip arrangement).

The following areas for improvement can be briefly mentioned:
Effects:
grouping a number of specific (new, enhanced) effects so that their strength are optimized.
Materials:
use of specific silicon metamaterial which possesses properties not existing in nature as the low-energy secondary electron generation.
Devices:
special coupling of individual components with the converting platform, enabling optimal use of their individual performances as well as their mutual interactions.
Technology:
manufacturing processing that allows the most freedom to collate the individual components of the converting platform (LEGO analogy).
Light management:
advanced processing of the light using different materials: plastic, glass, nanostructures, holography and diffraction.
Light-to-electricity conversion:
specific low-energy free-carrier generation and multiplication.

FIELD OF THE INVENTION

The field of application of this invention is preferentially the optimal light-to-electricity conversion using the entire wavelength spread of the solar spectrum.

The inorganic light-to-electricity converters used are fabricated from semiconductors, preferentially modulated silicon-based materials.

The design includes nanoscale local transformations and suitable superposition of optical, photonic, electronic and optoelectronic effects.

The manufacture of all-silicon converters makes use of widely used silicon technology.

The field of application is mainly the large domain of solar panels in order to produce electricity from solar radiation with a good efficiency and output.

ASPECTS AND PROBLEMS SOLVED BY THE INVENTION

The invention concerns simultaneously several aspects: physical effects, materials, devices and fabrication processing to significantly increase the efficiency of the light-to-electricity conversion.

Today light-to-electricity conversion is a one and only one step process. The all or nothing interaction dominates. The main weakness results from the spectral distribution of the solar light and the quantum mechanical rigidity of existing converters.

The objective of this invention is to overcome this fundamental maladjustment of any semiconductor converter resulting from the forbidden bandgap to the solar spectrum which leads unavoidably to only partial use of the available radiant energy. New conversion mechanisms transform the one step absorption-generation phenomenon into a multi-stage cycle of primary and secondary generations of carriers. The multistage cycle becomes possible due to a specific arrangement of several active components involved in different stages of the conversion cycle. The improvements are made at several complementary levels implicating: segtons, seg-matter, multiplying converters and, ultimately, the converting platform.

The platform can be designed on the principle of building blocks thus allowing possible variants for the optimal adaptation to the total visible and invisible solar spectrum as well as the industrial requirements of fabrication.

The invention solves the problem of the wrong proportionality of the heat and electricity that results from today's light-to-electricity conversion by the incorporation of multiple specific features and functions covering the optical, photonic and optoelectronic areas involved.

The present invention makes use of silicon (abundant, technologically mature and environmentally friendly) transformed on the nanoscale as presently the best imaginable material. The light-to-electricity multiplying converters described are preferentially built from it. It is particularly important that the "old" silicon can be provided with a new additional set of suitable energy levels due to active sub-structures containing segtons. The inclusion and distribution of these active components should to allow an efficient platform design, i.e., a specific multilayer architecture.

New devices can be manufactured using machines common in the photovoltaic, microelectronic and optoelectronic fields. In this way, cost of manufacture will remain reasonable in the light of the conversion improvement/cost increase ratio.

STATE OF THE ART

The limiting thermodynamic efficiency of unconcentrated solar irradiance into electrical energy in semiconductor devices is low under the maximum of 32% because of semiconductor transparency in the IR range and only partial utilization of photon energy in the blue-UV range. This efficiency is calculated assuming the detailed balance, a single threshold absorber, and thermal equilibrium between electrons and photons. When the unused kinetic energy of electrons is converted into free carriers by low-energy (about 0.3 eV) secondary generation, the efficiency at one-sun intensity increases to more than 60% (and even more including IR conversion).

Today's the photovoltaic effect is obtained and based on single junction and multi-junction planar semiconductor devices. This simple architecture exploits natural materials which may be optionally slightly modified.

Progress in PV conversion efficiency requires photonic and optoelectronic breakthroughs. Completing one-step PV conversion by additional new low-energy mechanisms is one of the most important challenges of modern photovoltaics.

GENERAL SUMMARY OF THE INVENTION AND THE FUNCTIONS

On the one hand, the invention uses new passive Concentrating Photovoltaics (CPV) technology, which concentrates and integrates a large amount of sunlight onto active converting material to adjust and optimize the total PV efficiency. In general, CPV technology is increasingly recognized as one of the most promising technologies to drive solar energy generation to cost-parity with other energy sources as fossil fuels. On the other hand, several new or improved conversion effects are combined to assume an entire conversion cycle. In relation with our optical and electric and electronic design, this technology promises to deliver solar energy which is really cost-competitive.

The incident solar spectrum can be suitably narrowed to be next projected on very efficient carrier multiplying converters. The light management allows decomposing the sunlight into spectral sub-bands, each headed a specialized converter for light-to-electricity conversion with the best possible performance. The choice of actual spectral bands takes into account the total efficiency of the distributed conversion, where final result is obtained from a specific combination (modulated characteristics) of partial efficiencies of all active components.

The upper opto-photonic platform is associated also with at least two photonic converters for transposing the ultra-violet and the infrared radiations in visible spectral sub-bands having a good yield for carrier multiplying converters. The host material for new imbricated effects is the bulk crystalline silicon.

The light management platform is placed before a set of light-to-electricity converters optimized due to a giant photoconversion. The thermalization of hot electrons is substituted by the electron multiplication resulting from collisional generations as a function of the excitation wavelength. Such a concept suitably manages interactions of optical and electronic phenomena. The final photoconversion results then from several succeeding stages of complementary and well-controlled components.

SHORT SUMMARY AND ESSENTIAL FUNCTIONS

The invention relates to a high yield multistage light-to-light and light-to-electricity platform unit that can exploit the entire visible and invisible spectrum of sunlight independently on time of day and season. The result is obtained by the optimal use of the unique possibilities of carrier low-energy secondary generation and multiplication by the simultaneous integration of optical, photonic and optoelectronic improvements.

A multi-layer architecture is developed around two coupled stages: opto-photonic platform and carrier multiplying platform. The opto-photonic platform makes a digital optical light management that allows a passive tracking of the sun to collect, filter, split and concentrate sunlight into sub-bands and to project them onto carrier multiplying platform containing dedicated light-to-electricity preferentially all-silicon converters. The total conversion efficiency is enhanced by a mutual optimization of both platforms taking into account low-energy multiplication capacity and optimized spectral sub-bands.

The UV and IR wavelengths are converted in visible and near-IR and projected onto the carrier multiplying platform to be converted in the same way that viable sub-bands of the sunlight.

In practice this corresponds to the total, complex and particularly efficient processing of the light-to-electricity conversion of the solar spectrum. The optimized efficiency becomes real from a large range of combined improvements. More particularly the invention is a multiplying light-to-electricity converting platform unit provided on its front face with antireflection and electronic passivation coatings or layers and with suitable electrode characterized in that it comprises:

an opto-phonic platform to form a light narrowed sub-band adapted to the related light-to-electricity optimal converter, this opto-phonic platform is composed of
- a UV radiation light-to-light down converter to a particular sub-band in the visible radiation domain based upon specific components such as silicon nanocrystals
- a harvesting diffractive grading component with light splitting means and several sub-band light into narrowed sub-band light concentrators to project each a spot of concentrated narrowed sub-band light on a downstream light-to-electricity adapted converter
- an IR radiation up conversion component based upon specific components such as rare earth ions
- a converting multiplying platform made of several optimal for each narrowed and concentrated sub-band light-to-electricity multiplying converters adapted to each related narrowed and concentrated sub-band of light spectrum they receive on their own exposure face.

As a first variant, the diffractive grading and the sub-band light-to-light concentrator are combined.

As a second variant, the UV light-to-light converter and the diffractive grading are combined in order to form one functional unit.

As a third variant, the diffractive grading and the IR radiation up conversion component co-operate in such a way that the converted IR radiation is directed to a special multiplying adapted converter.

BENEFITS OF THE INVENTION

According to the invention practically all the spectral components of the solar radiation are treated to obtain a greater amount of converted energy from the incident photon flux and improve overall conversion performance.

Visible and near-IR spectral sub-bands are efficiently converted due to the secondary electron generation. Other spectral components of solar radiation are converted in visible and near-IR spectral sub-bands and projected to associated converters.

The gain is double, from the large light collection which implies a greater amount of incident photon energy and from the better converter performance leading together to better overall performance. The optimized whole solar spectrum multiplying converting platform allows recovering the usually lost sub-bands of the incident solar radiation. The effect is enhanced by the photon harvesting independently on the incident angle.

In general, the invention allows overcoming the limitations arising from the maladjustment of semiconductor devices to convert efficiently the light spectrum, preferentially solar spectrum by limiting the inevitable losses of conventional converters. The main idea relies on the superposition of optical and electronic improvements in the conversion processing. Such a solution allows the insertion of active components working with new effects. In this way, useful effects of the giant photoconversion and multistage photogeneration may be considerably amplified. Specific device arrangements are much easier within such a platform design.

BRIEF DESCRIPTION OF THE DRAWINGS

The invention will be better understood with the help of the appended drawings according to the following list in which.

DETAILED DESCRIPTION OF THE INVENTION

A. Method

Figure 1:
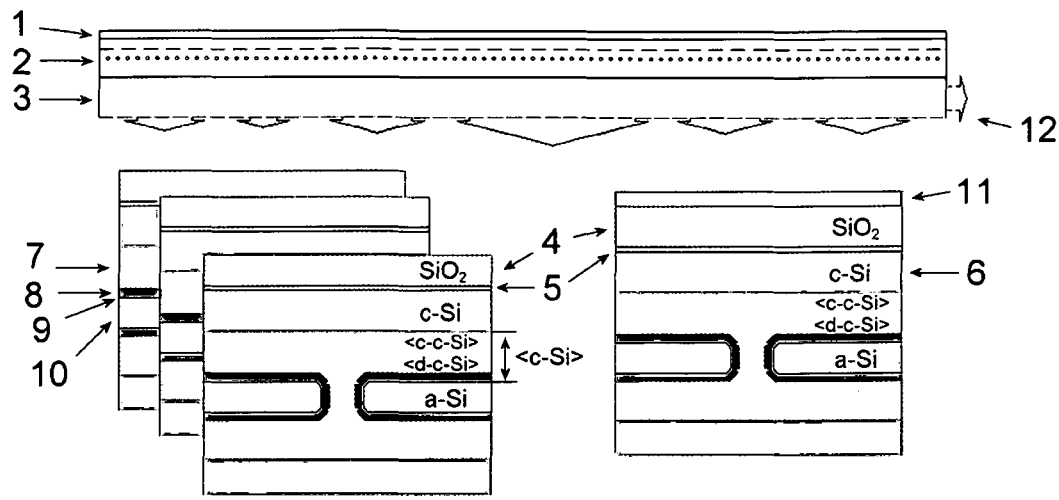
FIG. 1 is a general view, drawn not to scale, which illustrates the functional composition of an example of the multiplying converting platform unit for an optimal light-to-electricity conversion schematizing a simultaneous management of the incident light and of the light-to-electricity conversion according to the basic embodiment of the present invention. The upper graph represents an opto-photonic platform of the light management while the lower graphs represent schematically different light-to-electricity converters each of them being adapted to spectral sub-bands)

The invention relates to a method of the entire sunlight conversion based on a multifunctional multiplying converting platform . Efficient light-to-electricity converters with improved emitters are illuminated by narrow spectral sub-bands optimized to the carrier multiplication orders/steps.

The generic configuration contains at least two complementary sets: first opto-photonic light managing platform and second multiplying light-to-electricity conversion platform with a low-energy carrier multiplication.

The upper opto-photonic platform manages incident light and project it under the form of narrow spread sub-bands onto dedicated areas of multiplying light-to-electricity conversion platform lying under the opto-photonic platform. The total conversion efficiency is enhanced by a mutual optimization of both platforms taking into account low-energy multiplication capacity and optimized spectral sub-bands.

The proposed method is based on multiplying converters that are illuminated with narrowed optimized spectral sub-bands.

Processed sub-bands are transposed and optimized in close relationship with multiplication orders/steps. Each narrow bandwidth is so concentrated that it fits into the lowest energy of a corresponding multiplication step.

In this way, converted and concentrated sub-bands represent a discontinuous spectrum where each sub-band may be optimized with the respect of electron multiplication orders to allow the most effective light-to-electricity conversion. Ideally, of course, is to convert the solar spectrum in the way to get a series of predetermined quasi-monochromatic wavelengths.

The light managed by the upper opto-photonic platform takes the form of narrow sub-bands that are adapted to the beginning of electron multiplication orders/steps. The light-to-electricity converting platform/unit/component exploits an optimize device set that allows the best possible combination for the efficient cooperation with the spectrally transposed or converted incident light.

The method allows gathering more than one electron per photon in the blue-UV wavelength range. In this way, both phenomena opto-photonic improvement and light-to-electricity improvement are simultaneously used for the overall performance improvement of the silicon based solar cells.

The multistage conversion cycle starts with the primary generation (conventional mechanism induced by the photon absorption), then continues with secondary generations by multiple collisions of hot electrons with segtons (unconventional mechanism due to the specific low-energy generation). It is clear that spectral distributions of the best conversion probabilities represent in this case a specific aspect requiring a multi parameter coupled investigation form, both, photonic and electronic viewpoints. The secondary electrons are at the origin of an excess photocurrent observed at high photon energies. So that the maximum number of electrons can be released and form the largest possible electric current.

The main asset of Si-derived materials is the low cost of implementation. The emitter structure basis on silicon-based components.

B. Designs of Carrier Converting Platforms

The converting platform lying under opto-photonic platform contains an arrangement of adjusted multiplying converters that are illuminated by optimized spectral sub-bands. The photoconversion in multiplying converters can appear within one-level or multi-level substructures of a simple or multiform motives including objects of different shapes and dimensions: spherical, horizontal or vertical blocs, boards, pillars that can be adjusted to a given spectral sub-range (by depth, forms, superposition, . . . ). In this way, the set of electron energy levels is artificially tuned to efficient interaction with the narrow sub-bands of the solar spectrum.

The system of active substructures, preferentially buried within the emitter of the multiplying converter assume:

optimized capture cross section of a discharged segtons with regard of their energy level set and solar spectrum optimized distribution, of energy level sets at nanomembranes with the respect of the impurity band, segton band and conduction band usefully directed built-in electric field allowing a unipolar unidirectional conduction unipolar electron transport due to localized injection and extraction across nanomembranes—local mode of electron transport inside and outside seg-matter nanolayer extremely fast electron injection into seg-matter due to a quantum mechanical effect because of the wave nature of electron interactions (between impurity levels and segton sites)

coexistence of several electron subpopulations differentiated by their mean energy distribution (occupation of energy levels) and spatial distribution within converter suitable distribution of doping impurity and segton energy levels allowing tunnel transitions from the impurity levels to segton levels selective attraction or repulsion (from the electron injection and from the electron extraction viewpoints) of electrons at the nanoscale at limits of the seg-matter nanolayer suitable distribution of energy levels in the impurity band (electron sieving, screening—free segton level at $E_c$-0.41 eV and impurity level $E_c$-0.07 eV—down spread of impurity levels in energy band coexistence of different electron sub-populations inside and outside the seg-matter containment of electron sub-populations in the seg-matter: i) hot/warm—corpuscular nature—multiplication—intermediate rapidity effects, ii) equilibrium—corpuscular nature—low rapidity effects—extraction, iii) impurity/segton—wave nature—high rapidity effects—segton regeneration domination of photon events outside the seg-matter (electron events are negligible), and domination of electron events inside the seg-matter (photon events are negligible).

Such a complex structure is available through local modulations of the material at the nanoscale, which are made possible by the precise focalization of the incident beam energy that is tooling the device. The detailed substructure design is adjusted to the spectral sub-band using such parameters as seg-matter deep and specific arrangement.

C. Description by Means of the Drawings

The following description is a further explanation with the figures and the reference numerals in order to render the description and the whole explanation complete and easier to understand.

FIG. 1 is a general view, not to scale, which illustrates the functional composition of an example of the multiplying converting platform unit for an optimal light-to-electricity conversion schematizing a simultaneous management of the incident light and of the light-to-electricity conversion according to the basic embodiment of the present invention. The upper graph represents an opto-photonic platform of the light management while the lower graphs represent schematically different light-to-electricity converters each of them being adapted to spectral sub-band(s); some main components bear the reference numerals as follows:

1—protection antireflection coating or layer

2—UV down conversion layer into visible or/and near-IR (Si-nanocristal)

3—diffractive grading or gradings especially digital diffractive grading or gradings 4—electronic passivation layer 5—upper electrode layer 6—transition layer between the surface and the buried substructure (possibly, reservoir of free carriers)

7—transition layer of a buried substructure

8—nanolayer of the seg-matter (metamaterial)

9—lower limit of the set of buried substructures

10—hetero-interface component

11—IR-up conversion into visible or/and near-IR

12—lateral projection of the IR to a separate treatment

Figure 2:
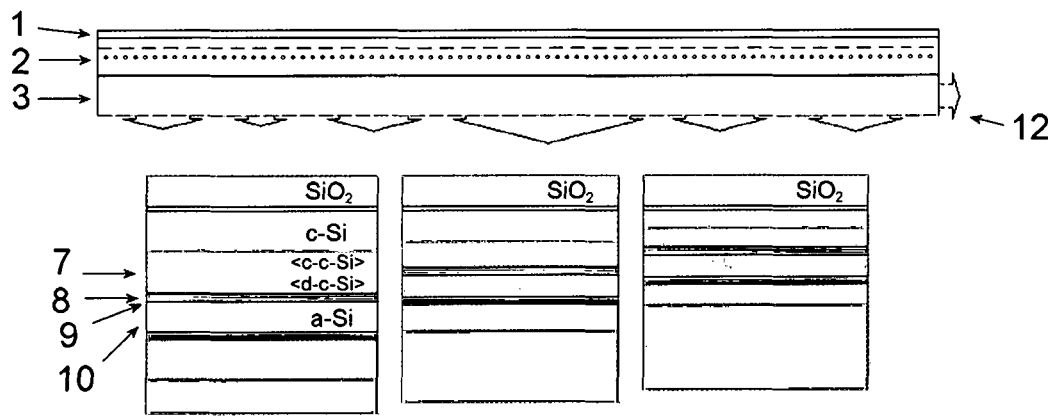
FIG. 2 is a general view, which illustrates the functional composition of the multiplying converting platform unit from FIG. 1 with a different design of optimized light-to-electricity converters. Each converter is adapted to different spectral sub-band(s). This example shows active single substructures that are buried at different depths depending on the incident spectral sub-band(s) (drawn not to scale)
Figure 3:
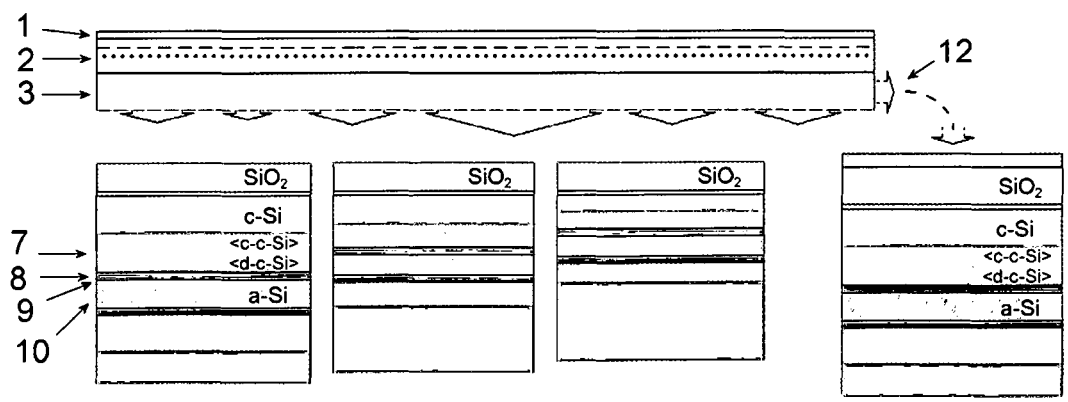
FIG. 3 is a general view, which illustrates the functional composition of the multiplying converting platform unit from FIG. 2 where the example of an additional functionality is added, i.e., specific optimized IR-to-electricity converter that is equipped with an up-converting component layer.
Figure 4:
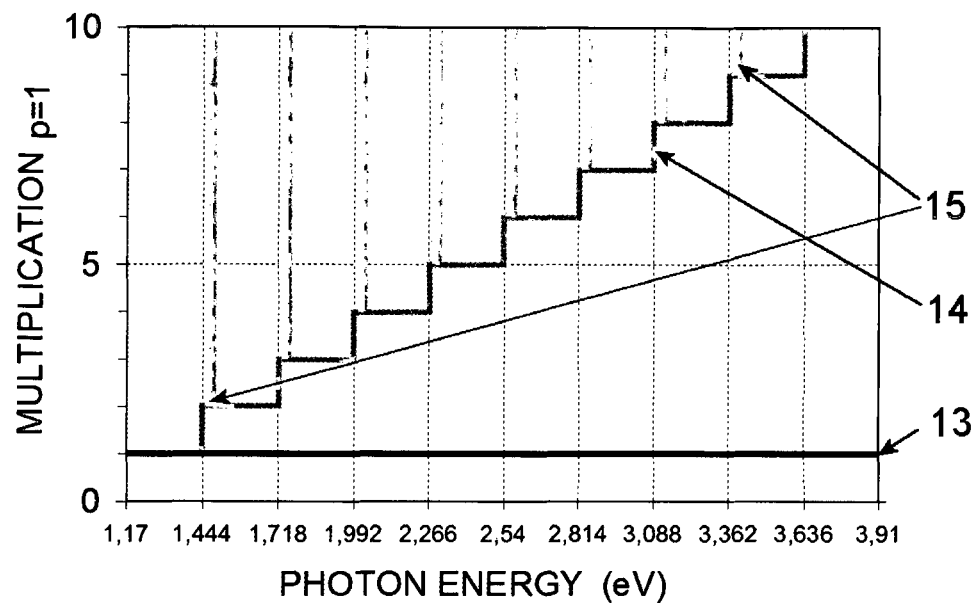
FIG. 4 is a representation of an example of multiplication orders/steps with the probability of the secondary generation p=1. In the case of the conventional converters multiplication doesn't exist and the electron number per absorbed photon equals unity. In the case of the low energy generation the electron number per absorbed photon depends on the photon energy as illustrated by the steps. Optimized sub-bands are concentrated on the first part of each step as indicates arrows. Each selected range of the solar spectrum is projected onto the optimized converter that works with its maximal performance, i.e. narrow spectral ranges.

FIG. 2 is a general view, which illustrates the functional composition of the multiplying converting platform unit from FIG. 1 with a different design of optimized light-to-electricity converters. Each converter is adapted to a different spectral sub-band(s). This example shows active single substructures that are buried at different depths depending on the incident spectral sub-band(s) (drawn not to scale);

FIG. 3 is a general view, which illustrates the functional composition of the multiplying converting platform unit from FIG. 2 where the example of an additional functionality is added, i.e., specific optimized IR-to-electricity converter that is equipped with with an up-converting component layer 11 possibly used for another application such as heating water;

FIG. 4 is an example of multiplication orders/steps with the probability of the secondary generation p=1. In the case of the conventional converters multiplication doesn't exist and the electron number per absorbed photon equals unity as illustrate by 13. In the case of the low energy generation the electron number per absorbed photon depends on the photon energy as illustrate the steps 14. Optimized sub-bands are concentrated on the first part of each step as indicates arrows 15. Each selected range of the solar spectrum is projected onto the optimized converter that works with its maximal performance, i.e. narrow spectral ranges 15.

Figure 5:
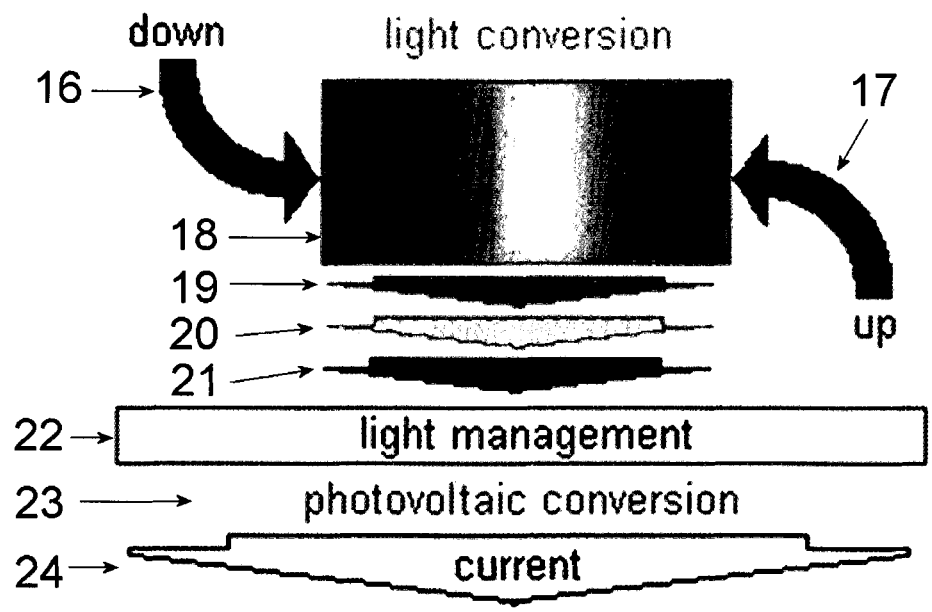
FIG. 5 is a scheme of light management, light-to-light conversion, and its transmission to the photovoltaic, light-to-electricity conversion (drawn not to scale)
Figure 6:
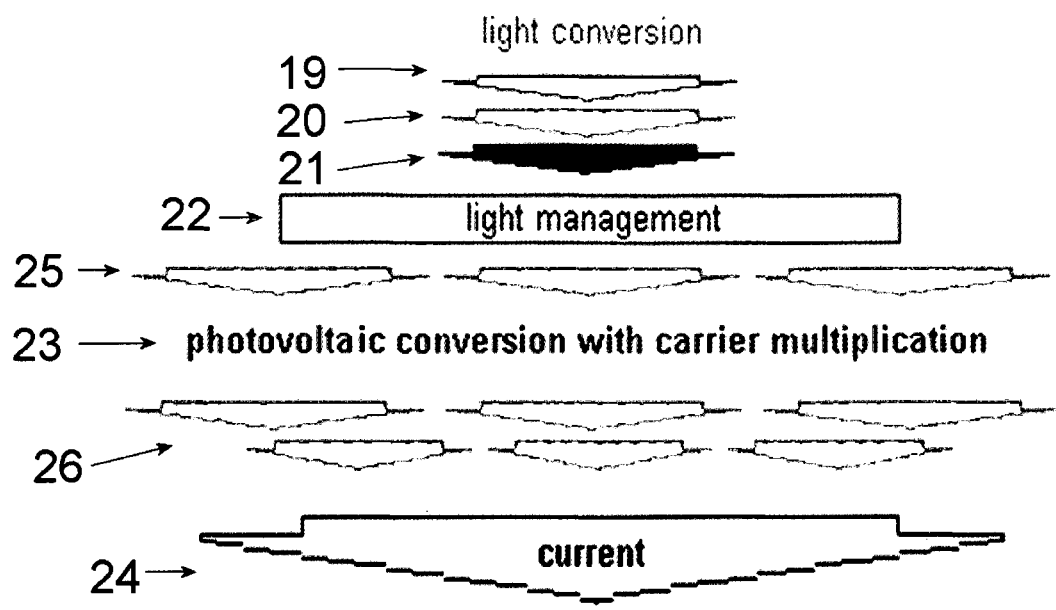
FIG. 6 is a scheme of the photovoltaic, light-to-electricity conversion from FIG. 5 with details concerning the carrier multiplication including spectral parts previously narrowed by light management, light-to-light conversion (drawn not to scale)
Figure 7:
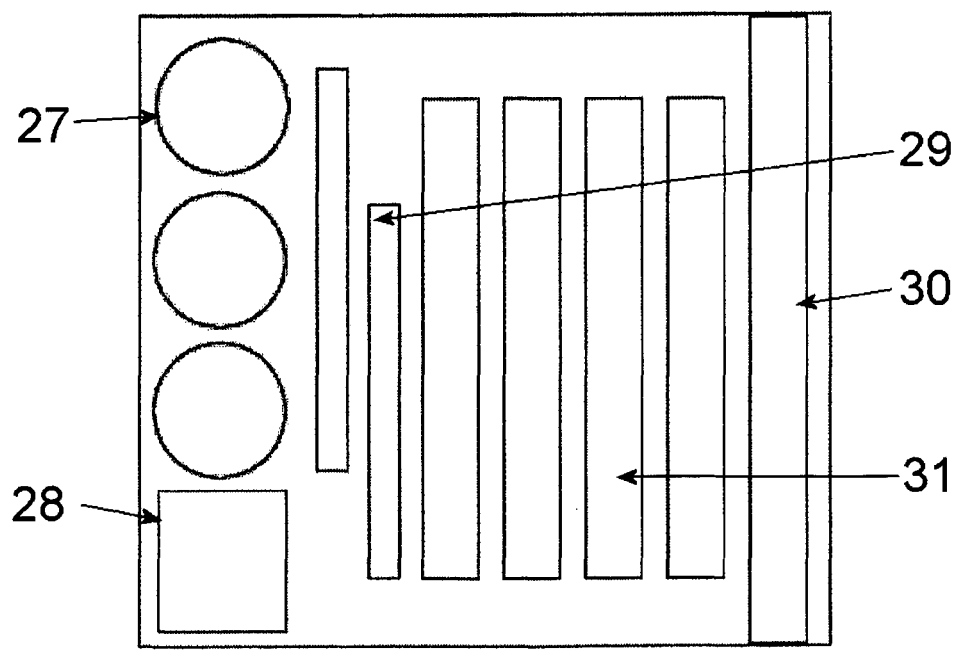
FIG. 7 represents an example of modular panel designs with more or less concentrated spots (rectangle and circular shapes) that are focalized onto adapted and optimized multiplying converters (drawn not to scale)

FIG. 5 is a scheme of light management, light-to-light conversion, and its transmission to the photovoltaic, light-to-electricity conversion (drawn not to scale); conversion (drawn not in the scale):

16—UV down-conversion
17—IR up-conversion
18—spectral components adapted/optimized for the light-to-electricity processing
19—down-converted UV part of the treated spectrum
20—as it is transmitted Visible and n-IR
21—up-converted IR part of the treated spectrum
22—result of the light management with a light harvesting
23—light beam(s) ready to projection onto optimized light-to-electricity converters
24—total current resulting from the light management and the free carrier multiplication;

FIG. 6 is a scheme of the photovoltaic, light-to-electricity conversion from FIG. 5 with details concerning the carrier multiplication including spectral parts previously narrowed by light management, light-to-light conversion (drawn not to scale):
25—three parts of spectrum that are absorbed in conventional way generating primary electrons
26—three parts of spectrum converted on primary electrons that generate (and multiply) next additional secondary electrons;

FIG. 7 presents examples of active areas of multiplying converters (modular panel designs) having different possible shapes inside of which are projected concentrated spectral sub-bands from the upper opto-photonic platform: 27—circular shape, 28—square shape, 29—group of shifted rectangle converters, 30—large rectangle converter and 31—group of a series of rectangle converters (drawn not to scale).

Figure 8:
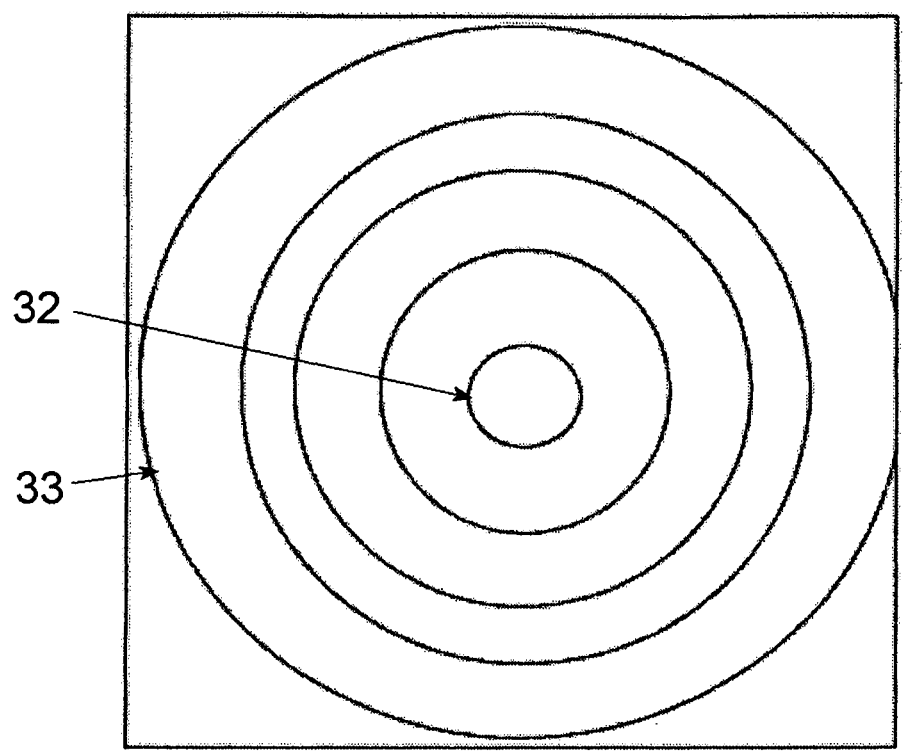
FIG. 8 represents another example of modular panel designs with more or less concentrated spots (circular shape) that are focalized onto adapted and optimized multiplying converters (drawn not to scale).

FIG. 8 presents an example of more or less concentric spots that are focalized and projected onto adapted and optimized multiplying converters: 32—central spot, 33—external spot (drawn not to scale).

The invention claimed is:

1. A photoelectric conversion device comprising:
a conversion component and an optics component;
wherein the conversion component comprises a plurality of solar cells, each of the plurality of solar cells comprising crystalline silicon and non-crystalline silicon, and, at a predetermined distance from a light incident surface of the respective solar cell, an interface formed by surfaces of crystalline and non-crystalline silicon, said interface having significant doping, and the predetermined distance selected to correspond with a respective predetermined wavelength,
wherein the respective predetermined wavelength corresponds to an energy value capable of generating a number of secondary electrons within or around the region formed by the interface, the number of secondary electrons is in addition to a primary electron generated within the crystalline silicon,
wherein the doping of the interface forms an electric field that tends to prevent recombination of said number of secondary electrons,
wherein the optics component comprises a lens having a diffraction grating and capable of and configured to split, diffract, and concentrate incident light into each of the respective predetermined wavelengths associated with each of the plurality of solar cells;
wherein the optics component further comprises a down-converter and an up-converter for converting ultraviolet and infrared wavelengths of the incident light, respectively, to each of the respective predetermined wavelengths.

2. The photoelectric conversion device of claim 1, wherein the down-converter comprises silicon nanocrystals or rare earth ions.

3. The photoelectric conversion device of claim 1, wherein the silicon nanocrystals or rare earth ions are embedded within a front surface of the down-converter.

4. The photoelectric conversion device of claim 1, wherein the up-converter is arranged between the lens and the plurality of solar cells.

5. The photoelectric conversion device of claim 1, wherein the down-converter and the lens are formed as an integral component.

6. The photoelectric conversion device of claim 1, wherein the up-converter is configured to laterally deviate the trajectory of a beam of a respective predetermine wavelength onto a respective solar cell.

7. The photoelectric conversion device of claim 1, wherein approximate values of any of the respective predetermined wavelengths are selected from the group consisting of 1.444 eV, 1.718 eV, 1.992 eV, 2.266 eV, 2.540 eV, 2.814 eV, 3.088 eV, 3.362 eV, 3.636 eV, and 3.91 eV.

8. The photoelectric conversion device of claim 1, wherein the interface is formed by nanoscale crystal defects and doping impurities.

9. The photoelectric conversion device of claim 1, wherein the optics component is configured to direct a portion of incident light to a use not associated with the plurality of solar cells or to photoelectric conversion.

* * * * *